(12) United States Patent
Ballantyne

(10) Patent No.: US 7,728,690 B2
(45) Date of Patent: Jun. 1, 2010

(54) METHOD AND APPARATUS FOR COMPENSATING FOR TUNING NONLINEARITY OF AN OSCILLATOR

(75) Inventor: Gary John Ballantyne, Christchurch (NZ)

(73) Assignee: QUALCOMM, Incorporated, San Diego, CA (US)

( * ) Notice: Subject to any disclaimer, the term of this patent is extended or adjusted under 35 U.S.C. 154(b) by 47 days.

(21) Appl. No.: 11/875,766

(22) Filed: Oct. 19, 2007

(65) Prior Publication Data

US 2009/0102564 A1    Apr. 23, 2009

(51) Int. Cl.
H03C 3/08 (2006.01)
H03C 3/06 (2006.01)
H03L 7/093 (2006.01)

(52) U.S. Cl. .................. 332/128; 332/124; 331/16; 331/23

(58) Field of Classification Search .......... 331/16, 331/17, 34, 36 C, 1 A, 44, 177 R, 177 V, 331/23; 327/156, 157, 159; 332/145, 119, 332/124, 128, 127

See application file for complete search history.

(56) References Cited

U.S. PATENT DOCUMENTS

| | | | |
|---|---|---|---|
| 4,564,815 A * | 1/1986 | Naito | 329/325 |
| 6,909,331 B2 | 6/2005 | Ballantyne | |
| 6,980,581 B1 * | 12/2005 | Sha et al. | 375/130 |
| 7,015,738 B1 * | 3/2006 | Cao | 327/159 |
| 2007/0036238 A1 * | 2/2007 | Matero et al. | 375/296 |
| 2007/0149148 A1 * | 6/2007 | Yoshikawa et al. | 455/110 |
| 2008/0191811 A1 * | 8/2008 | Liang | 332/124 |

* cited by examiner

Primary Examiner—Robert Pascal
Assistant Examiner—Ryan J Johnson
(74) Attorney, Agent, or Firm—Larry J. Moskowitz; William M. Hooks

(57) ABSTRACT

Techniques to compensate for nonlinearity of a tuning function of an oscillator are described. The tuning nonlinearity of the oscillator may be modeled as a disturbance input to the oscillator and may be compensated with an equal but opposite disturbance. In one design, a nonlinearity correction signal to compensate for the tuning nonlinearity may be generated, e.g., based on a phase error signal in a phase-locked loop (PLL) and a scaling factor determined adaptively. The nonlinearity correction signal may compensate for the n-th (e.g., second) order tuning nonlinearity, and an n-th order (e.g., squared) modulating signal may be used to derive the scaling factor and the nonlinearity correction signal. A control signal for the oscillator may be generated based on the nonlinearity correction signal and possibly one or more other signals. The control signal may be applied to the oscillator to adjust the oscillation frequency of the oscillator.

21 Claims, 7 Drawing Sheets

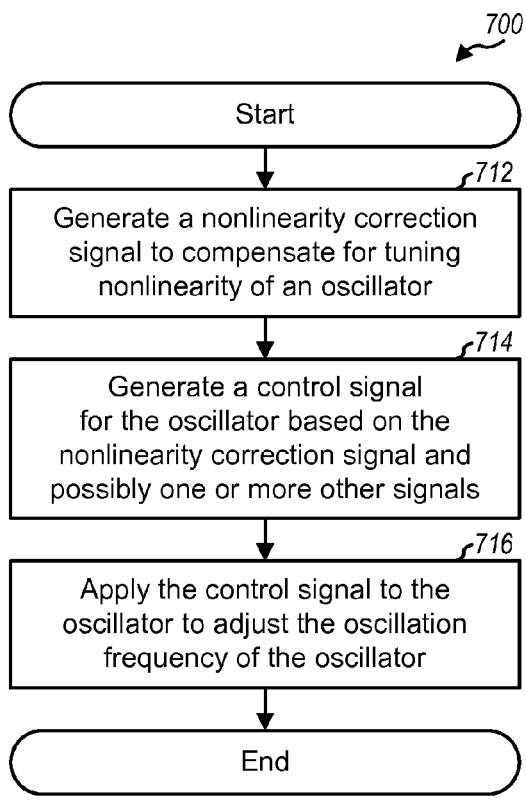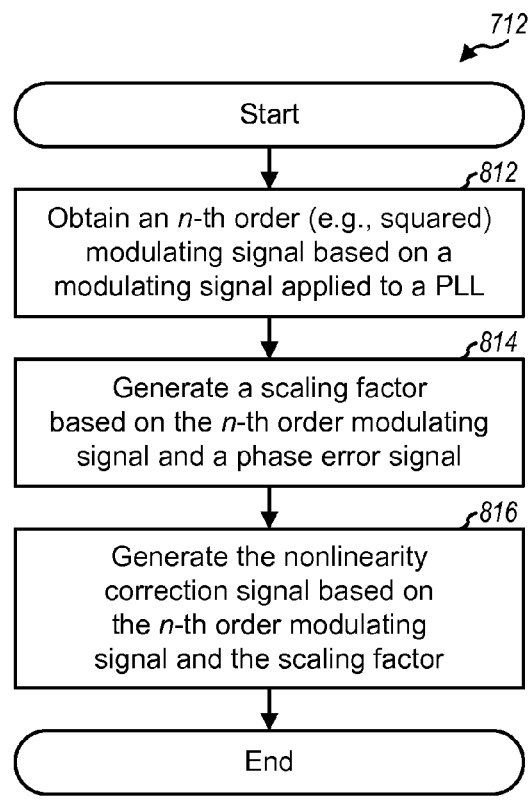
FIG. 7
FIG. 8

METHOD AND APPARATUS FOR COMPENSATING FOR TUNING NONLINEARITY OF AN OSCILLATOR

BACKGROUND

I. Field

The present disclosure relates generally to electronics, and more specifically to techniques for controlling an oscillator.

II. Background

Oscillators are an integral part of many electronics circuits and are particularly important in communication circuits. For example, transmitters and receivers use local oscillator (LO) signals for frequency upconversion and downconversion, respectively. The LO signals are typically generated with oscillators.

An oscillator may have an oscillation frequency that may be varied with a control signal. The oscillator may be characterized by a tuning function, which is a function of the oscillation frequency versus the control signal. For a linear tuning function, the oscillation frequency varies linearly with the control signal. A linear tuning function may be desirable if a signal generated by the oscillator is modulated with data. However, the tuning function of the oscillator is typically not linear, and tuning nonlinearity refers to deviations of the tuning function from a linear function. The tuning nonlinearity may degrade the quality of a modulated signal and adversely impact performance.

SUMMARY

Techniques to compensate or correct for the nonlinearity of a tuning function of an oscillator are described herein. The terms "compensate" and "correct" are used interchangeably herein. In an aspect, the tuning nonlinearity of the oscillator may be modeled as a disturbance input to the oscillator and may be compensated with an equal but opposite disturbance.

In one design, a nonlinearity correction signal to compensate for the tuning nonlinearity of the oscillator may be generated, e.g., based on a phase error signal in a phase-locked loop (PLL) and a scaling factor that may be determined adaptively. A control signal for the oscillator may be generated based on the nonlinearity correction signal and possibly one or more other signals. The control signal may be applied to the oscillator to adjust the oscillation frequency of the oscillator.

In one design, the nonlinearity correction signal may compensate for the n-th (e.g., second) order tuning nonlinearity of the oscillator. An n-th order (e.g., squared) modulating signal may be obtained based on a modulating signal applied to the PLL. The scaling factor may be determined based on the n-th order modulating signal and the phase error signal, e.g., by multiplying the n-th order modulating signal and the phase error signal, scaling the result with an adaptation factor, and filtering (e.g., accumulating) the scaled result. The nonlinearity correction signal may then be generated based on the n-th order modulating signal and the scaling factor.

Various aspects and features of the disclosure are described in further detail below.

BRIEF DESCRIPTION OF THE DRAWINGS

FIG. 7 shows a process for controlling an oscillator.

FIG. 8 shows a process for generating a nonlinearity correction signal.

DETAILED DESCRIPTION

The techniques described herein may be used for various types of oscillator having an oscillation frequency that can be varied by a control signal. For example, the techniques may be used for a DCO, a voltage controlled oscillator (VCO), a current controlled oscillator (ICO), a voltage controlled crystal oscillator (VCXO), etc. An oscillator with variable oscillation frequency may be used for various applications such as a polar modulator, a quadrature modulator, a phase modulator, a frequency modulator, a demodulator, etc. For clarity, certain aspects of the techniques are described below for a DCO used in a polar modulator.

Figure 1:
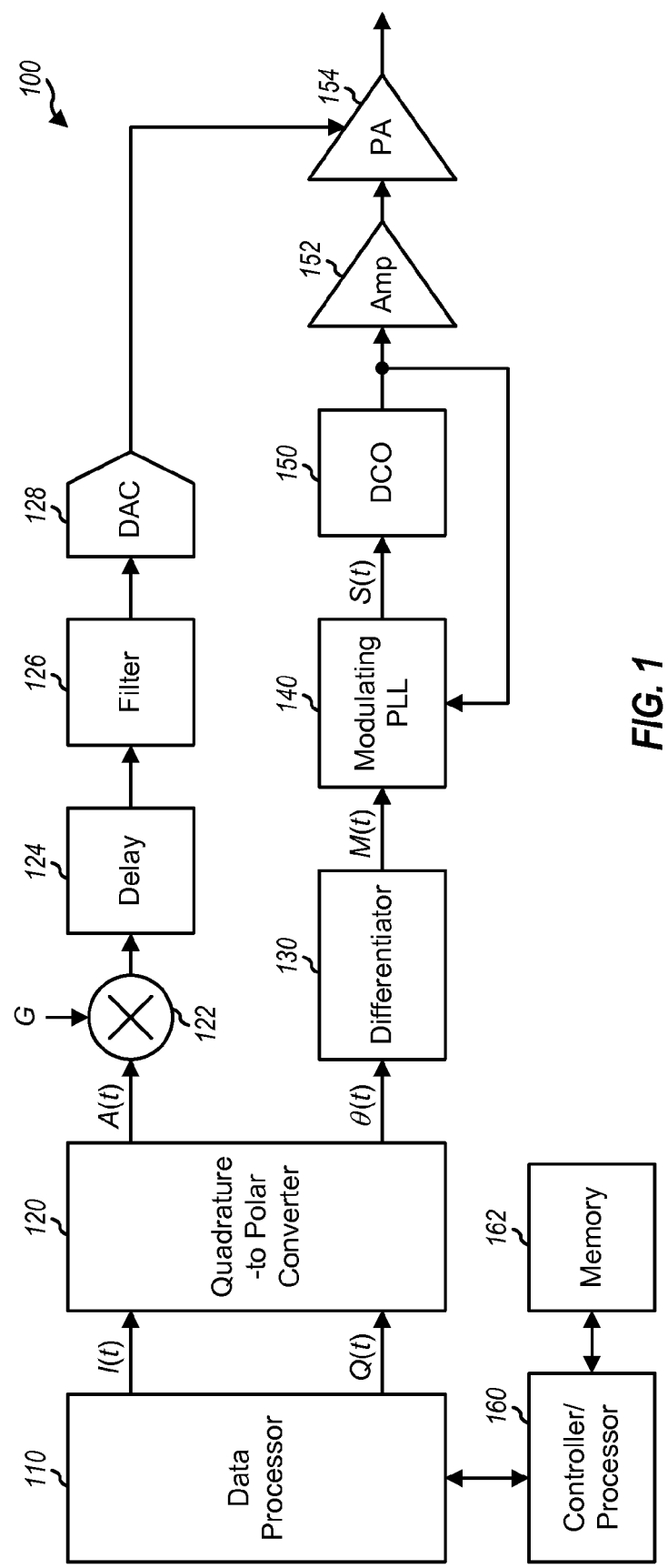
FIG. 1 shows a block diagram of a communication device.

FIG. 1 shows a block diagram of a design of a communication device 100 that performs polar modulation. Device 100 may be used in a wireless communication device, a cellular phone, a personal digital assistant (PDA), a handheld device, a wireless modem, a cordless phone, a wireless station, a Bluetooth device, etc. Device 100 may also be used for various wireless communication systems such as Code Division Multiple Access (CDMA) systems, Time Division Multiple Access (TDMA) systems, Frequency Division Multiple Access (FDMA) systems, Orthogonal FDMA (OFDMA) systems, wireless local area networks (WLANs), etc. A CDMA system may implement a radio technology such as cdma2000, Wideband-CDMA (W-CDMA), etc. A TDMA system may implement a radio technology such as Global System for Mobile Communications (GSM). These various systems and radio technologies are known in the art.

Within device 100, a data processor 110 may process (e.g., encode) data to be transmitted to obtain coded data. Processor 110 may map the coded data to symbols based on a modulation scheme such as Gaussian minimum shift keying (GMSK), 8-ary phase shift keying (8-PSK), quadrature phase shift keying (QPSK), quadrature amplitude modulation (QAM), etc. Processor 110 may also perform other processing (e.g., spreading, scrambling, etc.) in accordance with a radio technology used for communication to obtain complex-valued samples. Processor 110 may provide the real part of each complex-valued sample in an inphase data signal I(t) and may provide the imaginary part of each complex-valued sample in a quadrature data signal Q(t). A quadrature-to-polar converter 120 may receive the data signals I(t) and Q(t), convert each complex-valued sample from Cartesian to polar coordinates, and provide an envelope signal A(t) and a phase signal θ(t). The envelope signal may also be referred to as a magnitude signal or an amplitude signal. The phase signal may also be referred to as an angle signal.

In the envelope path, a multiplier 122 may multiply the envelope signal with a gain G and provide an amplified envelope signal. Multiplier 122 may be used for power control to obtain a desired output power level. A delay unit 124 may provide a programmable amount of delay to time-align the envelope signal and the phase signal. A filter 126 may filter the delayed envelope signal with a suitable filter response. A digital-to-analog converter (DAC) 128 may convert the filtered envelope signal to analog and provide an output envelope signal. The gain of a power amplifier (PA) 154 may be varied by the output envelope signal to achieve amplitude modulation.

In the phase path, a differentiator 130 may differentiate the phase signal θ(t) and provide a modulating signal M(t), which may contain the frequency component of the data signals I(t) and Q(t). Differentiator 130 may implement a difference equation and may generate the modulating signal as M(t)=θ(t)−θ(t−1), where θ(t) and θ(t−1) are phase values for two consecutive sample periods. A modulating PLL 140 may receive the modulating signal M(t) and generate a control signal S(t) for a DCO 150. DCO 150 may generate a phase modulated signal that is modulated by the modulating signal. An amplifier (Amp) 152 may amplify the phase modulated signal. PA 154 may further amplify the output of amplifier 152 based on the output envelope signal and provide a radio frequency (RF) output signal that is both phase and amplitude modulated.

A controller/processor 160 may control the operation of data processor 110 and other blocks within device 100. A memory 162 may store data and program codes for controller/processor 160 and/or other blocks. Memory 162 may be implemented external to controller/processor 160 (as shown in FIG. 1) or internal to the controller/processor.

Various blocks in device 100 may be implemented digitally. For example, processor 110 through DAC 128, differentiator 130, most of PLL 140, and controller/processor 160 may be implemented with one or more digital signal processors (DSPs), reduced instruction set computer (RISC) processors, central processing units (CPUs), etc. The digital blocks may be implemented on one or more application specific integrated circuits (ASICs) and/or other ICs. The remaining blocks in device 100 may be implemented with analog circuits. Part of PLL 140, DCO 150, amplifier 152, and/or PA 154 may be implemented on one or more RF integrated circuits (RFICs), mixed-signal ICs, etc.

Figure 2:
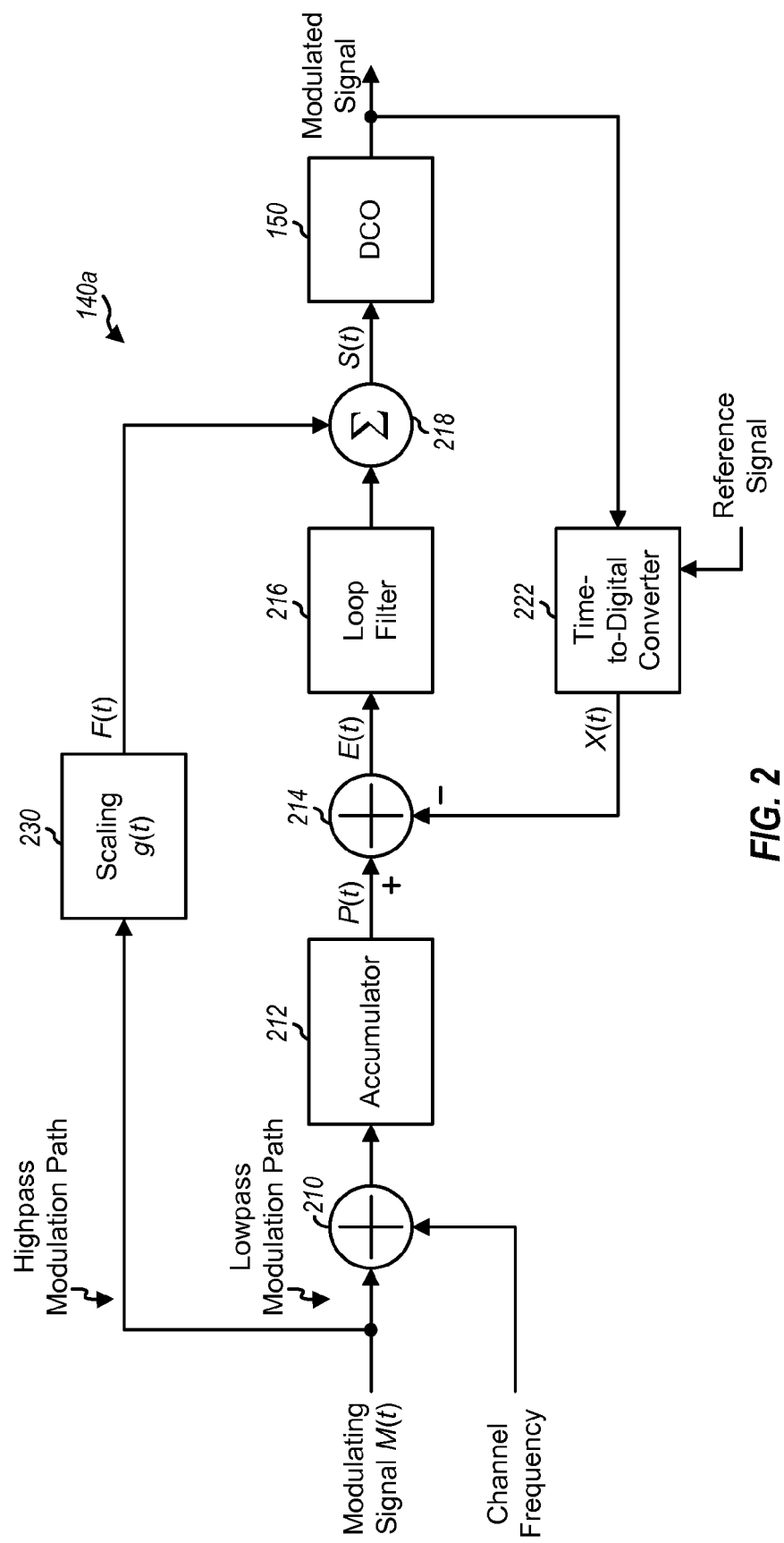
FIG. 2 shows a block diagram of a modulating PLL.

FIG. 2 shows a block diagram of a modulating PLL 140a, which is one design of PLL 140 in FIG. 1. In this design, PLL 140a implements two-point or dual-port modulation in order to achieve high bandwidth modulation. The modulating signal M(t) is provided to both a lowpass modulation path and a highpass modulation path. In the lowpass modulation path, a summer 210 receives and sums the modulating signal M(t) with a static value for a center frequency of a frequency channel used for transmission. An accumulator 212 accumulates the output of summer 210 and provides a first modulating signal P(t). The accumulation essentially converts frequency to phase. In the highpass modulation path, a scaling unit 230 receives and scales the modulating signal M(t) with a gain g(t) and provides a second modulating signal F(t).

A time-to-digital converter (TDC) 222 receives a modulated signal from DCO 150 and a reference signal, compares the phases of the two signals, and provides a TDC signal X(t) that is proportional to the detected phase difference between the two signals. TDC 222 implements a phase sensor for PLL 140a. Although not shown in FIG. 2, a divider may divide the modulated signal in frequency by an integer or non-integer divider ratio and provide a divided signal to TDC 222. The reference signal may be from a crystal oscillator (XO), a VCXO, or some other type of oscillator having an accurate frequency.

A summer 214 receives and subtracts the TDC signal X(t) from the first modulating signal P(t) and provides a phase error signal E(t). A loop filter 216 filters the phase error signal and provides a filtered phase error signal. Loop filter 216 sets the loop dynamics of PLL 140a. A summer 218 sums the filtered phase error signal and the second modulating signal and provides the control signal S(t) for DCO 150. The control signal has B bits of resolution, where B may be any suitable value such as 8, 12, 16, 20, 24, etc. The control signal adjusts the frequency of DCO 150 such that the phase of the modulated signal follows the phase of the modulation.

The bandwidth of the data signals I(t) and Q(t) in FIG. 1 is determined by the system and is approximately 100 KHz for GSM, 620 KHz for cdma2000, 1.92 MHz for W-CDMA, etc. The signal bandwidth is expanded by the Cartesian-to-polar conversion. The bandwidth of the lowpass modulation path of PLL 140a is determined by loop filter 216 and is relatively narrow (e.g., approximately 80 KHz) in order to achieve the desired noise filtering and loop dynamics. By applying the modulating signal M(t) via separate highpass and lowpass modulation paths, PLL 140a can modulate DCO 150 with a wider signal bandwidth than the closed-loop bandwidth of the PLL.

FIG. 2 shows an example design of a modulating PLL. A modulating PLL may also be implemented with other designs, some of which are described in U.S. Pat. No. 6,909,331, entitled "PHASE LOCKED LOOP HAVING A FORWARD GAIN ADAPTATION MODULE," issued Jun. 21, 2005.

Figure 3:
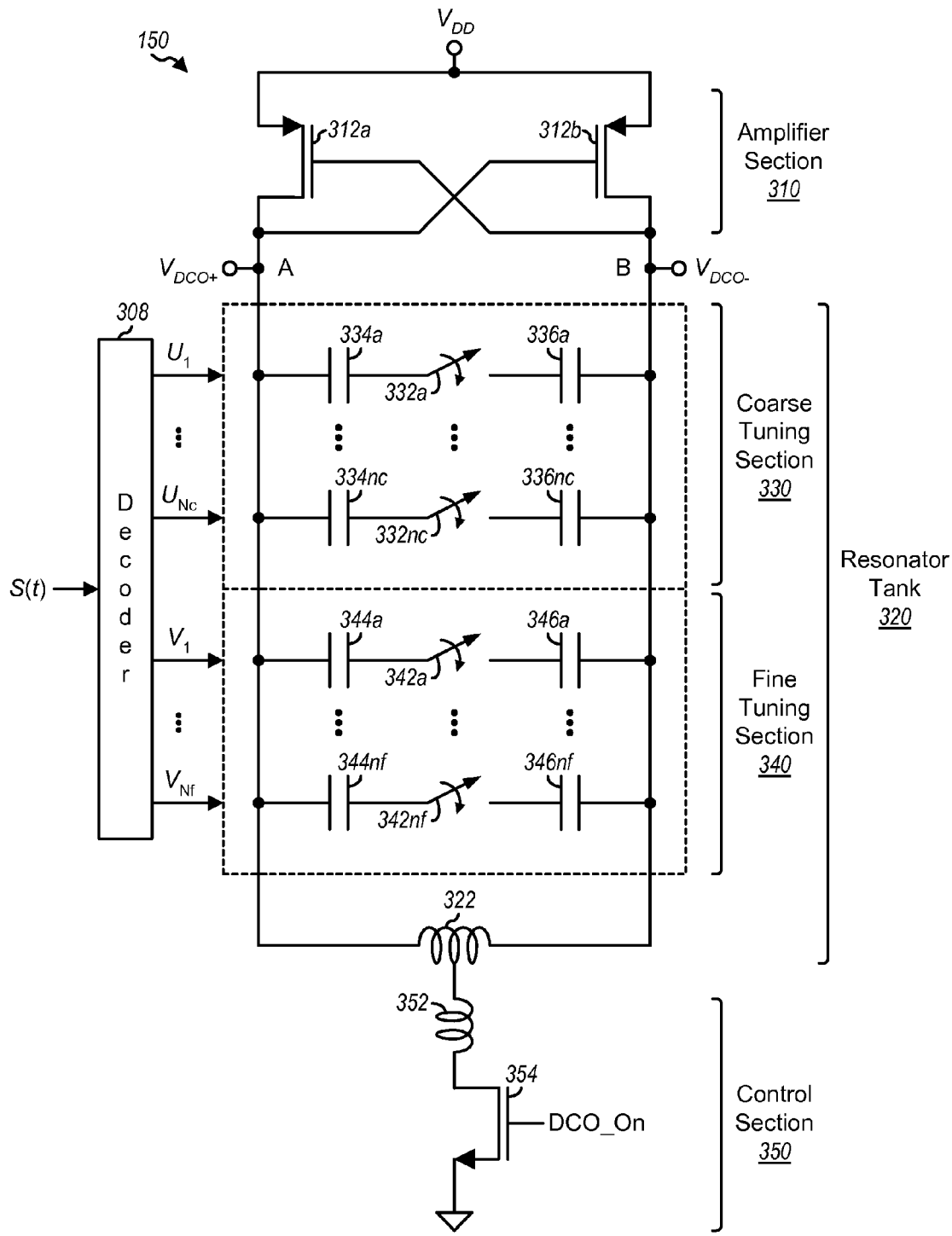
FIG. 3 shows a schematic diagram of a digitally controlled oscillator (DCO).

FIG. 3 shows a schematic diagram of a design of DCO 150 in FIG. 1. In this design, DCO 150 includes an amplifier section 310, a resonator tank 320, and a control section 350. Amplifier section 310 is composed of P-channel field effect transistors (P-FETs) 312a and 312b. P-FET 312a has its source coupled to a power supply $V_{DD}$, its drain coupled to a node A, and its gate coupled to a node B. P-FET 312b has its source coupled to the power supply, its drain coupled to node B, and its gate coupled to node A. Nodes A and B provide the differential modulated signal $V_{DCO+}$ and $V_{DCO-}$, respectively. Amplifier section 310 may also be implemented with N-channel field effect transistors (N-FETs) in place of or in addition to P-FETs 312a and 312b.

In the design shown in FIG. 3, resonator tank 320 includes a coarse tuning section 330, a fine tuning section 340, and an inductor 322, all of which are coupled in parallel and between nodes A and B. Inductor 322 has an inductance of L. In general, resonator tank 320 may include any number of tuning sections.

Coarse tuning section 330 includes Nc coarse tuning branches that may be enabled or disabled to select different coarse oscillation frequencies, where in general Nc may be any value. For example, each coarse tuning branch may be enabled to lower the oscillation frequency by several MHz. Each coarse tuning branch includes a switch 332 and capacitors 334 and 336, which are coupled in series and between nodes A and B. Switch 332 in each coarse tuning branch is controlled (e.g., opened or closed) by a respective capacitor select signal $U_i$. A decoder 308 may receive the control signal S(t) from summer 218 in FIG. 2 and generate Nc capacitor select signals $U_1$ through $U_{N_c}$ for the Nc coarse tuning branches. For each coarse tuning branch, when switch 332 is closed, capacitors 334 and 336 are coupled between nodes A and B and affect the oscillation frequency of DCO 150. Conversely, when switch 332 is opened, capacitors 334 and 336 are not coupled between nodes A and B and do not affect the oscillation frequency of DCO 150. Capacitors 334a through 334nc and 336a through 336nc may have the same capacitance of $C_c$ for thermometer decoding. These capacitors may also have different capacitances, e.g., for binary decoding.

Fine tuning section 340 includes Nf fine tuning branches that may be enabled or disabled to select different fine oscillation frequencies, where in general Nf may be any value. For example, each fine tuning branch may be enabled to lower the oscillation frequency by several KHz. Each fine tuning branch includes a switch 342 and capacitors 344 and 346, which are coupled in series and between nodes A and B. Switch 342 in each fine tuning branch is controlled by a respective capacitor select signal $V_j$. Decoder 308 may generate Nf capacitor select signals $V_1$ through $V_{Nf}$ for the Nf fine tuning branches based on the control signal S(t). Capacitors 344a through 344nf and 346a through 346nf may have the same capacitance of $C_f$ for thermometer decoding or may have different capacitances.

Resonator tank 320 may also be implemented with other types of resonator circuit such as micro-electro-mechanical systems (MEMS).

Control section 350 includes an inductor 352 and an N-channel FET (N-FET) 354. Inductor 352 is coupled between a center tap of inductor 322 and the drain of N-FET 354. N-FET 354 has its gate receiving a DCO_On signal and its source coupled to circuit ground. When the DCO_On signal is at logic high, N-FET 354 is turned on, and DCO 150 is enabled. N-FET 354 may be replaced with some other power control circuit. For example, N-FET 354 may be replaced with a variable current source that can control the amount of bias current for DCO 150 to achieve good performance and low power consumption. N-FET 354 may also be shorted with a wire.

The oscillation frequency $f_{osc}$ of DCO 150 may be expressed as:

$$f_{osc} = \frac{1}{2\pi\sqrt{LC}}, \quad \text{Eq (1)}$$

where L is the inductance of inductor 322, and C is the total capacitance of both coarse tuning section 330 and fine tuning section 340. For simplicity, equation (1) assumes no parasitic capacitance or inductance and that the oscillation frequency is determined based solely on the inductance L and capacitance C of resonator tank 320.

The control signal S(t) from PLL 140 may be used to select the capacitors in tuning sections 330 and 340 in DCO 150. The total capacitance C may be a linear function of the control signal and may be expressed as:

$$C = K_1 \cdot S(t), \quad \text{Eq (2)}$$

where $K_1$ is a constant that is determined by the design of tuning sections 330 and 340. Equation (2) assumes that the capacitors in tuning sections 330 and 340 are matched.

From equations (1) and (2), the oscillation frequency $f_{osc}$ may be expressed as a function of the control signal S(t), as follows:

$$f_{osc} = \frac{K_2}{\sqrt{S(t)}}, \quad \text{Eq (3)}$$

$$\text{where } K_2 = \frac{1}{2\pi\sqrt{LK_1}}.$$

A tuning function of DCO 150 is a function of the oscillation frequency $f_{osc}$ versus the control signal S(t). Ideally, the tuning function should be linear, so that the oscillation frequency varies linearly with the control signal. However, if the total capacitance varies linearly with the control signal as shown in equation (2) and if the oscillation frequency varies inversely with the square root of the total capacitance as shown in equation (1), then the oscillation frequency is inherently not a linear function of the control signal as shown in equation (3).

Figure 4:
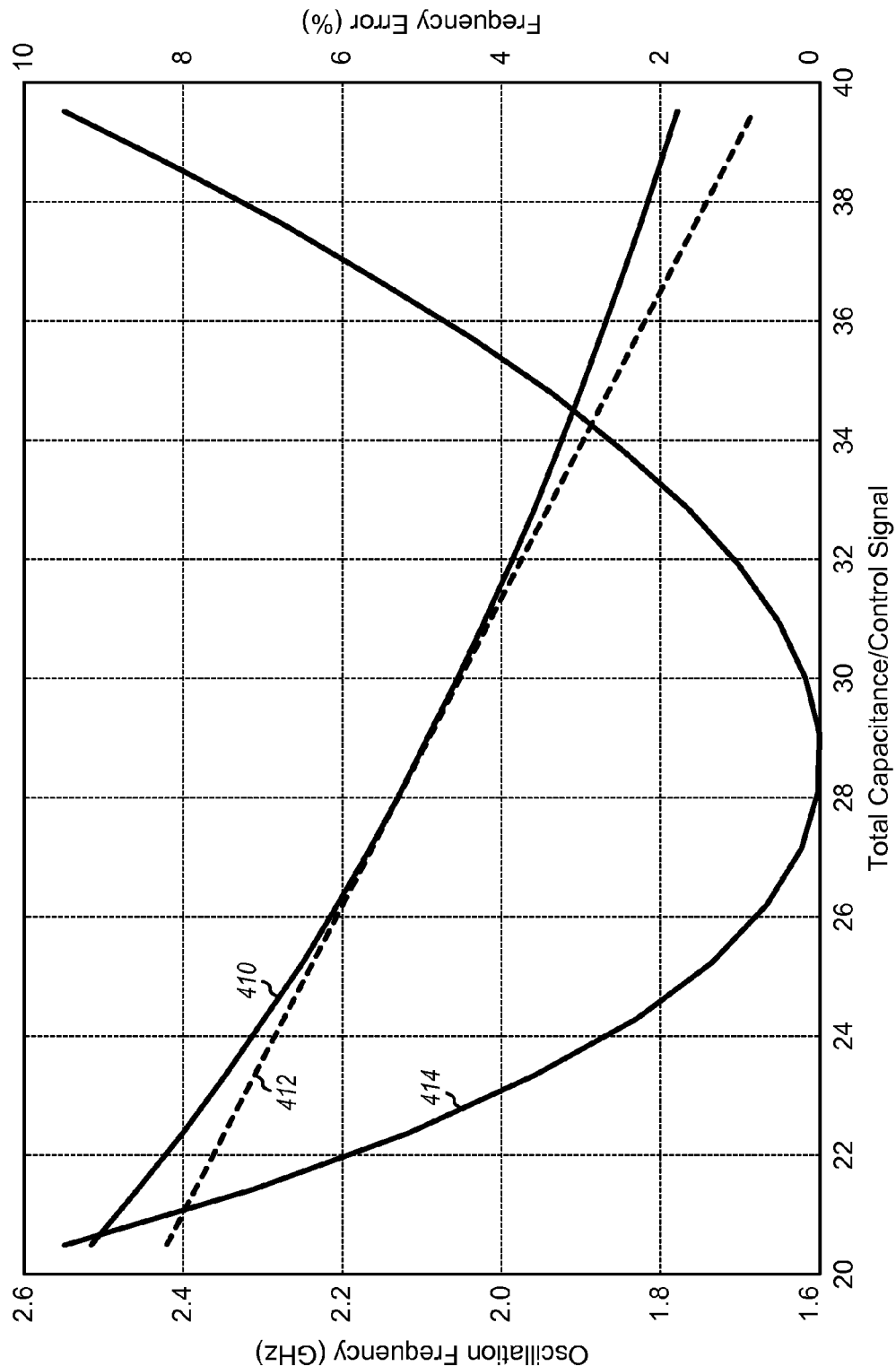
FIG. 4 shows plots of a tuning function and tuning nonlinearity.

FIG. 4 shows a plot 410 of a tuning function of oscillation frequency $f_{osc}$ versus total capacitance C (or equivalently, control signal S(t)) for an example design of DCO 150. The left vertical axis shows the oscillation frequency $f_{osc}$ (which is applicable to plots 410 and 412), the right vertical axis shows frequency error (which is applicable to plot 414), and the horizontal axis shows the total capacitance C (which is applicable to all three plots 410, 412 and 414). Plot 412 shows a linear function having the same frequency range as plot 410. As shown by plots 410 and 412, the DCO tuning is not a linear function. Plot 414 shows the difference between plots 410 and 412 and indicates the deviation in the DCO tuning from linear. As shown by plot 414, the DCO tuning deviates more from the linear function for progressively larger offset from a center capacitance value. Plot 414 also shows that the nonlinearity of the DCO tuning may be approximated with a quadratic function over a capacitance range of interest.

For clarity, the DCO tuning nonlinearity has been described for a specific DCO design shown in FIG. 3. The DCO tuning nonlinearity may have other characteristics for other DCO designs. For example, a combination of fixed capacitors and variable capacitors may be used in a resonator tank, and the DCO tuning nonlinearity may be different for this resonator tank. In general, the DCO tuning nonlinearity may be defined by any function, one example of which is shown by plot 410 in FIG. 4. The DCO tuning nonlinearity may have an approximately quadratic error function for many DCO designs.

PLL 140 and DCO 150 may be used for modulation in various communication systems. An important parameter for modulation is peak frequency deviation, which is the maximum rate of change of the phase of the modulating signal M(t) used to modulate PLL 140. The peak frequency deviation is dependent on the bandwidth of the modulating signal and may have a significant impact on the design of DCO 150. This is because the DCO tuning is inherently nonlinear, and the deviation from linear grows approximately quadratically for progressively larger frequency deviation.

PLL 140 and DCO 150 may be used for GMSK and 8-PSK modulations in GSM. The peak frequency deviation for GSM modulations is reasonably modest. As an example, for 8-PSK modulation in GSM, the peak frequency deviation may be approximately ±350 KHz. The DCO tuning function may be relatively linear over this modest peak frequency deviation.

PLL 140 and DCO 150 may also be used for modulation in cdma2000, W-CDMA, and/or other systems with high bandwidth modulations. For example, the peak frequency deviation for W-CDMA may be approximately ±8 MHz even with filtering. The peak frequency deviation for W-CDMA may thus be much larger than the peak frequency deviation for GSM. The large frequency deviation due to high bandwidth modulation combined with the nonlinearity of the DCO tuning may generate excessive phase errors in the modulated signal from DCO 150. This problem may be encountered in polar realizations of high bandwidth modulations.

The phase errors due to large frequency deviation and nonlinear DCO tuning may be mitigated in several ways. In one design, the phase signal from the modulating signal M(t) may be filtered to reduce the peak frequency deviation. However, the filtered phase signal may still have a large frequency deviation due to the wide bandwidth of the modulating signal, and filtering the phase signal further would corrupt the information in the modulating signal.

In another design, the nonlinearity of the DCO tuning may be corrected by characterizing the tuning nonlinearity, applying an inverse characteristic to the control signal S(t) to obtain a compensated control signal, and using the compensated control signal to control DCO 150. If the compensation is accurate, then the oscillation frequency would be a linear function of the control signal S(t). Since the nonlinearity of the DCO tuning may change with temperature, power supply, etc., the compensation may be performed in a manner to account for changes in the tuning nonlinearity due to these various factors.

In an aspect, the nonlinearity of the DCO tuning may be corrected by applying a correction signal that accounts for the nonlinearity. The tuning nonlinearity may be modeled as a disturbance input to DCO 140 and may thus be compensated with an equal but opposite disturbance. For DCO 150, the tuning nonlinearity may be dominated by second order effect and may thus be compensated by injecting a scaled version of the squared frequency modulation.

In one design, a nonlinearity correction signal Z(t) that compensates for the DCO tuning nonlinearity may be generated as follows:

$$Z(t)=k(t)\cdot M^2(t), \qquad \text{Eq (4)}$$

where k(t) is a scaling factor.

The modulating signal M(t) contains the frequency modulation and hence determines the deviation from a nominal frequency. In the design shown in equation (4), the modulating signal M(t) is squared to model the quadratic characteristics of the DCO tuning nonlinearity. The squared modulating signal is then multiplied with the scaling factor k(t) to obtain the desired amount of nonlinearity correction. The scaling factor k(t) determines how much of the squared frequency modulation to add to compensate for the tuning non-linearity. Since the tuning nonlinearity may change with temperature, power supply, etc., the scaling factor k(t) may be adaptively determined to obtain good nonlinearity compensation even with changes in temperature, power supply, etc.

In another design, the nonlinearity correction signal Z(t) may be generated as follows:

$$Z(t)=k_1(t)\cdot M(t)+k_2(t)\cdot M^2(t)+k_3(t)\cdot M^3(t)+\ldots, \qquad \text{Eq (5)}$$

where $k_1(t)$ is a scaling factor for the first order term of the DCO tuning nonlinearity, $k_2(t)$ is a scaling factor for the second order nonlinearity term, and $k_3(t)$ is a scaling factor for the third order nonlinearity term.

In general, the nonlinearity correction signal Z(t) may be generated with any number of terms and any term of the modulating signal M(t). More terms may be used to more accurately model the DCO tuning nonlinearity. Depending on the design of DCO 150, the tuning nonlinearity may or may not be dominated by the second order/quadratic term. One or more signal terms may be used to model one or more nonlinearity terms. The n-th signal term $M^n(t)$ may be scaled with the scaling factor $k_n(t)$ to obtain a nonlinearity correction signal for the n-th nonlinearity term. The scaling factor $k_n(t)$ may be a fixed value or may be adaptively determined. The n-th signal term may also be omitted by setting the scaling factor $k_n(t)$ to zero.

Figure 5:
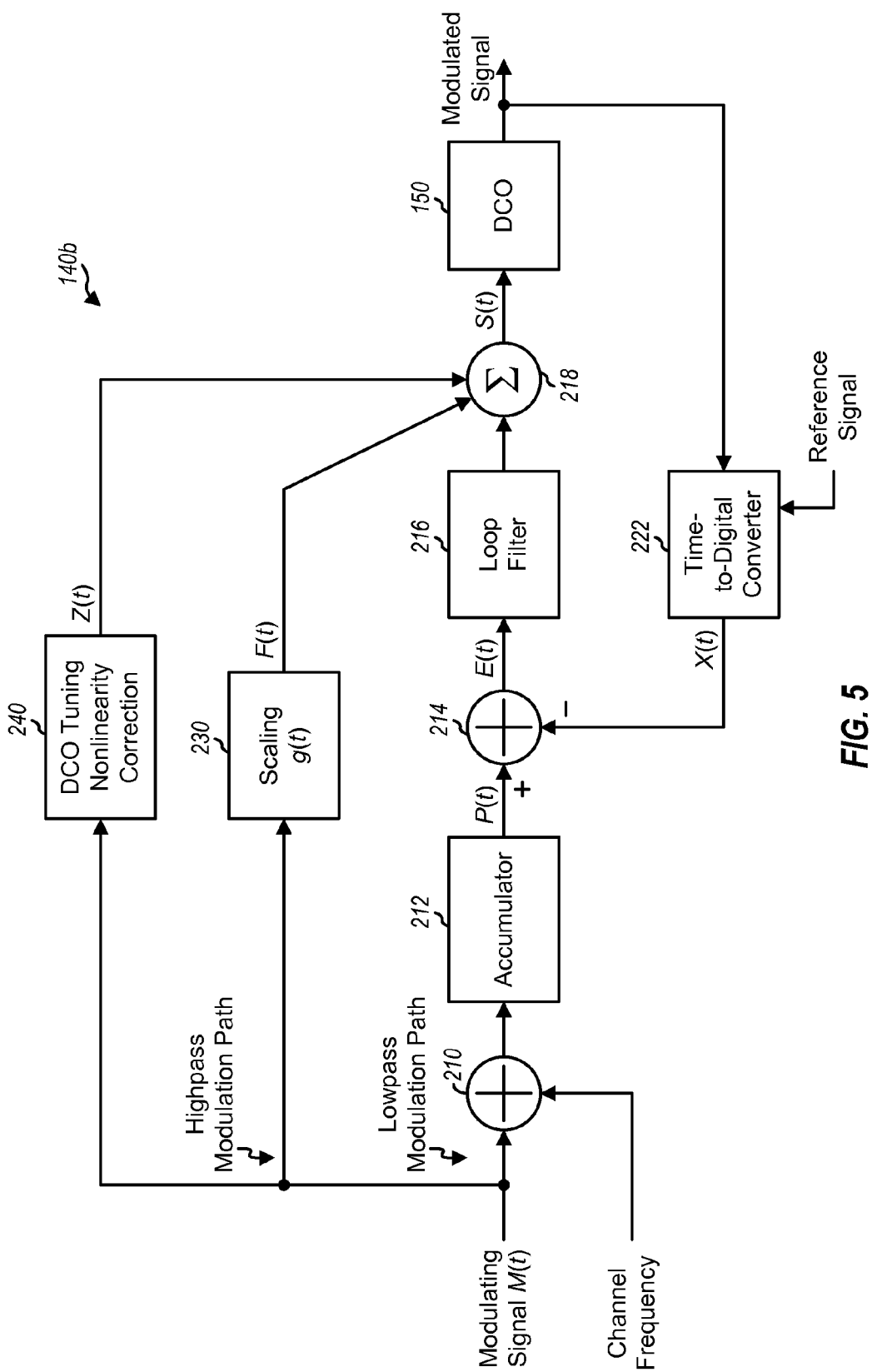
FIG. 5 shows a block diagram of a modulating PLL with nonlinearity correction.

FIG. 5 shows a block diagram of a modulating PLL 140b with nonlinearity correction for DCO tuning. PLL 140b is another design of PLL 140 in FIG. 1 and includes all blocks in PLL 140a in FIG. 2. PLL 140b further includes a tuning nonlinearity correction unit 240 that receives the modulating signal M(t) and provides the nonlinearity correction signal Z(t). Unit 240 may generate the nonlinearity correction signal as shown in equation (4) or (5) or based on some other function.

Summer 218 receives the filtered phase error signal from loop filter 216, the second modulating signal F(t) from scaling unit 230, and the nonlinearity correction signal Z(t) from unit 240. Summer 218 sums the three received signals and provides the control signal S(t) for DCO 150.

Figure 6:
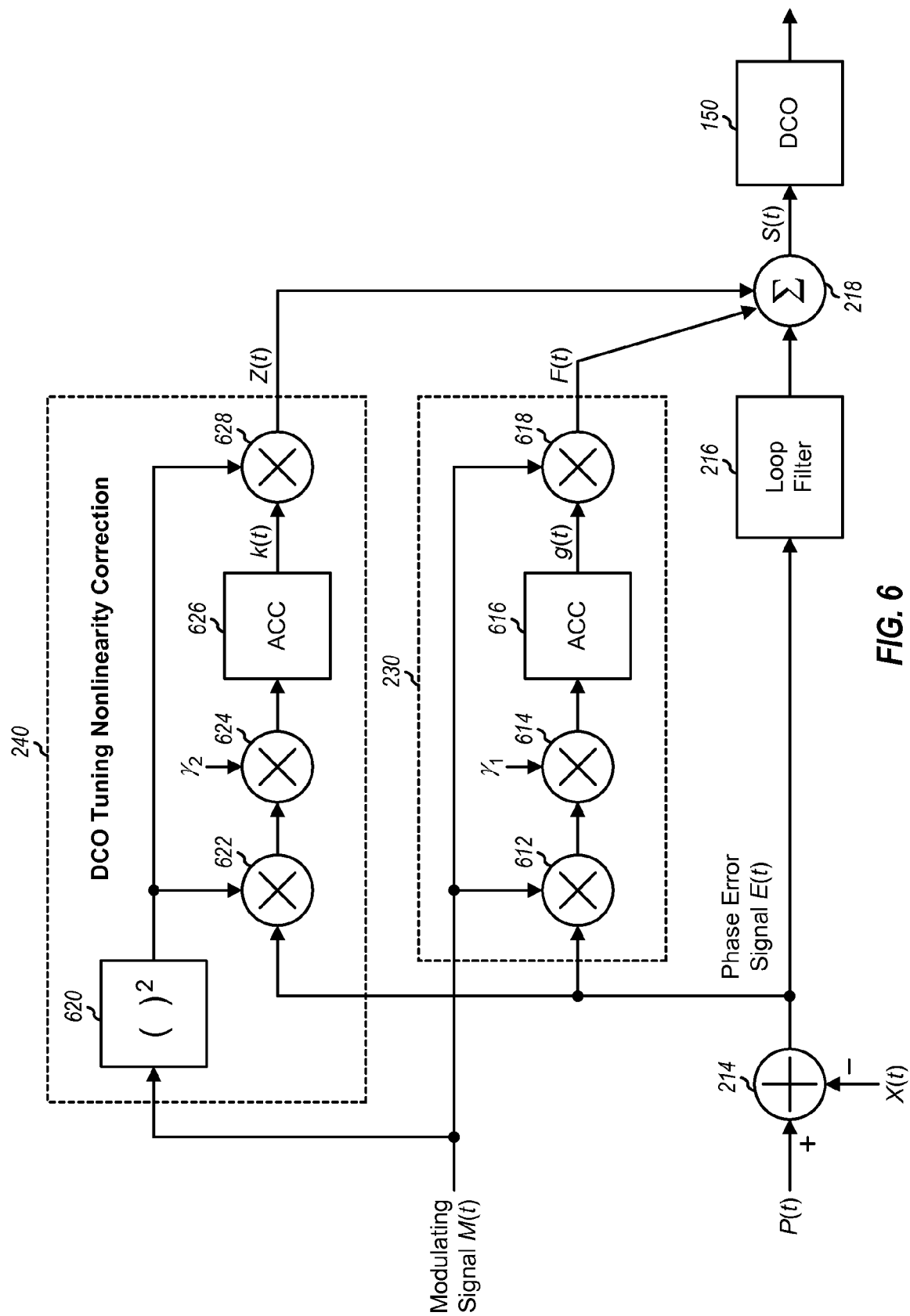
FIG. 6 shows a design of a tuning nonlinearity correction unit.

FIG. 6 shows a design of scaling unit 230 and tuning nonlinearity correction unit 240 in PLL 140b in FIG. 5. In this design, the gain g(t) in unit 230 and the scaling factor k(t) in unit 240 are both adaptively determined based on the phase error signal E(t) from summer 214 in FIG. 5. Unit 240 generates the nonlinearity correction signal Z(t) based on the design shown in equation (4).

Within scaling unit 230, a multiplier 612 multiplies the modulating signal M(t) with the phase error signal E(t). A multiplier 614 scales the output of multiplier 612 with an adaptation factor $\gamma_1$. An accumulator 616 accumulates the output of multiplier 614 and provides the gain g(t). Multiplier 614 and accumulator 616 provide a transfer function of $\gamma_1/s$ in the s-domain. A multiplier 618 multiplies the modulating signal M(t) with the gain g(t) and provides the second modulating signal F(t).

The gain g(t) may be expressed in the time domain as followed:

$$g(t)=g(t-1)+\gamma_1\cdot M(t-1)\cdot E(t-1). \qquad \text{Eq (6)}$$

Equation (6) has the form of a least mean square (LMS) algorithm. The adaptation factor $\gamma_1$ determines the rate of convergence of the gain g(t) to a final value. The derivation of the gain g(t) is described in further detail in the aforementioned U.S. Pat. No. 6,909,331.

Within nonlinearity correction unit 240, a squarer 620 squares the modulating signal M(t) and provides a squared modulating signal $M^2(t)$. A multiplier 622 multiplies the squared modulating signal with the phase error signal E(t). A multiplier 624 scales the output of multiplier 622 with an adaptation factor $\gamma_2$. An accumulator 626 accumulates the output of multiplier 624 and provides the scaling factor k(t). Multiplier 624 and accumulator 626 provide a transfer function of $\gamma_2/s$ in the s-domain. A multiplier 628 multiplies the squared modulating signal with the scaling factor and provides the nonlinearity correction signal Z(t).

The scaling factor k(t) may be expressed in the time domain as followed:

$$k(t)=k(t-1)+\gamma_2\cdot M^2(t-1)\cdot E(t-1). \qquad \text{Eq (7)}$$

Equation (7) also has the form of an LMS algorithm. The adaptation factor $\gamma_2$ determines the rate of convergence of the scaling factor k(t) to a final value.

FIG. 6 shows adaptive determination of the scaling factor k(t) and generation of the nonlinearity correction signal Z(t) for second order nonlinearity by unit 240. In general, the scaling factor $k_n(t)$ for the n-th order nonlinearity may be adaptively determined by generating the n-th order modulating signal $M^n(t)$, multiplying the n-th order modulating signal with the phase error signal E(t), scaling the result with an adaptation factor $\gamma_n$, and accumulating the scaled result to obtain the scaling factor $k_n(t)$. The nonlinearity correction signal for the n-th order nonlinearity may then be generated by multiplying the n-th order modulating signal $M^n(t)$ with the scaling factor $k_n(t)$.

FIG. 6 shows one design of adaptively determining the scaling factor k(t) used to compensate for the DCO tuning nonlinearity. The scaling factor k(t) may also be adaptively determined in other manners and using other adaptive algorithms known in the art. In another design, accumulator 626 (which is a digital integrator) may be replaced with a filter function such as a/(s+b) in the s-domain, where a is a constant that determines the gain of the function, and b is a constant that determines the bandwidth of the function. In general, any suitable filter function may be used in place of accumulator 626. Accumulation may be considered as a filter function of 1/s in the s-domain. In yet another design, the phase error signal E(t) may be filtered before being applied to multiplier 622. In yet another design, the phase error signal E(t) and/or other input (e.g., the modulating signal M(t) or the squared modulating signal) may be represented with reduced resolution. For example, only the sign (+ or −) of a signal may be used, and simple 1-bit multiplication may be performed, which may greatly reduce complexity.

Modulation performance may be improved by compensating for the nonlinearity of the DCO tuning as described above. Computer simulations were performed for a W-CDMA system and confirmed the benefits of tuning nonlinearity correction. The computer simulations showed improvements in error vector magnitude (EVM) when tuning nonlinearity correction is applied. The improvements in EVM may, in turn, improve decoding performance.

FIG. 7 shows a design of a process 700 for controlling an oscillator, e.g., a DCO or some other type of oscillator with variable oscillation frequency. A nonlinearity correction signal to compensate for tuning nonlinearity of the oscillator may be generated, e.g., based on a phase error signal in a PLL and a scaling factor (block 712). A control signal for the oscillator may be generated based on the nonlinearity correction signal and possibly one or more other signals (block 714). The control signal may be applied to the oscillator to adjust the oscillation frequency of the oscillator (block 716).

The oscillator may be a DCO with a resonator tank having a capacitance C determined based on the control signal. The resonator tank may have a number of capacitors that may be selectable based on the control signal. The capacitance of the resonator tank may be determined based on the selected capacitors and may be linearly related to the control signal. In general, the oscillator may have any tuning function, and the nonlinearity correction signal may compensate for any tuning nonlinearity.

FIG. 8 shows a design of block 712 in FIG. 7. The nonlinearity correction signal may compensate for the n-th (e.g., second) order tuning nonlinearity of the oscillator, where in general n may be greater than one. An n-th order (e.g., squared) modulating signal may be obtained based on a modulating signal applied to the PLL (block 812). A scaling factor may be generated based on the n-th order modulating signal and a phase error signal (block 814). The nonlinearity correction signal may then be generated based on the n-th order modulating signal and the scaling factor (block 816).

For block 814, the n-th order modulating signal and the phase error signal may be multiplied to obtain a first signal. A second signal may be derived based on the first signal and an adaptation factor, e.g., by scaling the first signal with the adaptation factor. The adaptation factor may also be applied to the n-th order modulating signal instead of the phase error signal. The second signal may be filtered (e.g., accumulated) to obtain the scaling factor. The scaling factor may also be determined in other manners.

For polar modulation, an envelope signal and a phase signal may be generated, e.g., by performing quadrature to polar conversion on an inphase signal and a quadrature signal. The modulating signal may be generated based on (e.g., by differentiating) the phase signal. The modulating signal may be applied via a lowpass modulation path to a first point of the PLL and also via a highpass modulation path to a second point of the PLL, e.g., as shown in FIGS. 2 and 5. The nonlinearity correction signal may be applied to the second point of the PLL, e.g., as shown in FIGS. 5 and 6. The control signal may be generated with the modulating signal applied to the first and second points of the PLL and the nonlinearity correction signal applied to the second point of the PLL, e.g., as shown in FIG. 5.

The techniques described herein may be implemented by various means. For example, these techniques may be implemented in hardware, firmware, software, or a combination thereof. For a hardware implementation, the processing units used to compensate for tuning nonlinearity may be implemented within one or more ASICs, DSPs, digital signal processing devices (DSPDs), programmable logic devices (PLDs), field programmable gate arrays (FPGAs), processors, controllers, micro-controllers, microprocessors, electronic devices, other electronic units designed to perform the functions described herein, a computer, or a combination thereof.

For a firmware and/or software implementation, the techniques may be implemented with modules (e.g., procedures, functions, etc.) that perform the functions described herein. The firmware and/or software instructions/code may be stored in a memory (e.g., memory 162 in FIG. 1) and executed by a processor (e.g., processor 160). The memory may be implemented within the processor or external to the processor. The firmware and/or software instructions/code may also be stored in a computer/processor-readable medium such as random access memory (RAM), read-only memory (ROM), non-volatile random access memory (NVRAM), programmable read-only memory (PROM), electrically erasable PROM (EEPROM), FLASH memory, floppy disk, compact disc (CD), digital versatile disc (DVD), magnetic or optical data storage device, etc. The instructions/code may be executable by one or more processors and may cause the processor(s) to perform certain aspects of the functionality described herein.

An apparatus implementing the techniques described herein may be a stand-alone device or may be part of a larger device. A device may be (i) a stand-alone IC, (ii) a set of one or more ICs that may include memory ICs for storing data and/or instructions, (iii) an ASIC such as a mobile station modem (MSM), (iv) a module that may be embedded within other devices, (v) a receiver, cellular phone, wireless device, handset, or mobile unit, (vi) etc.

The PLLs described herein may be implemented within an IC, a mixed-signal IC, an ASIC, a printed circuit board (PCB), an electronics device, etc. The PLLs may also be fabricated with various IC process technologies such as complementary metal oxide semiconductor (CMOS), N-channel MOS (N-MOS), P-channel MOS (P-MOS), bipolar junction transistor (BJT), bipolar-CMOS (BiCMOS), silicon germanium (SiGe), gallium arsenide (GaAs), etc. The DCO and/or other types of oscillator may be implemented within an RFIC, a mixed-signal IC, a PCB, etc. The DCO and/or other types of oscillator may also be fabricated with various IC process technologies.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus for communication, comprising:
at least one processor to generate a nonlinearity correction signal to compensate for tuning nonlinearity of an oscillator, to generate a control signal for the oscillator based on the nonlinearity correction signal, and to apply the control signal to the oscillator to adjust an oscillation frequency of the oscillator, wherein the nonlinearity correction signal compensates for second order tuning nonlinearity of the oscillator, and wherein the at least one processor obtains a squared modulating signal based on a modulating signal, determines a scaling factor based on the squared modulating signal and a phase error signal, and generates the nonlinearity correction signal based on the squared modulating signal and the scaling factor.

2. The apparatus of claim 1, wherein the at least one processor multiplies the squared modulating signal and the phase error signal to obtain a first signal, derives a second signal based on the first signal and an adaptation factor, and filters the second signal to obtain the scaling factor.

3. The apparatus of claim 1, wherein the at least one processor multiplies the modulating signal and the phase error signal to obtain a first signal, derives a second signal based on the first signal and an adaptation factor, filters the second signal to obtain a second scaling factor, generates a second modulating signal based on the modulating signal and the second scaling factor, and generates the control signal based further on the second modulating signal.

4. An apparatus for communication, comprising:
at least one processor to generate a nonlinearity correction signal to compensate for tuning nonlinearity of an oscillator, to generate a control signal for the oscillator based on the nonlinearity correction signal, and to apply the control signal to the oscillator to adjust an oscillation frequency of the oscillator, wherein the nonlinearity correction signal compensates for n-th order tuning nonlinearity of the oscillator, where n is greater than one, and wherein the at least one processor obtains an n-th order modulating signal based on a modulating signal, determines a scaling factor based on the n-th order modulating signal and a phase error signal, and generates the nonlinearity correction signal based on the n-th order modulating signal and the scaling factor.

5. The apparatus of claim 4, wherein the at least one processor multiplies the n-th order modulating signal and the phase error signal to obtain a first signal, derives a second signal based on the first signal and an adaptation factor, and filters the second signal to obtain the scaling factor.

6. The apparatus of claim 4, wherein the at least one processor applies the modulating signal via a lowpass modulation path to a first point of a phase locked loop (PLL), applies the modulating signal via a highpass modulation path to a second point of the PLL, applies the nonlinearity correction signal to the second point of the PLL, and generates the control signal with the modulating signal applied to the first and second points of the PLL and the nonlinearity correction signal applied to the second point of the PLL.

7. The apparatus of claim 4, wherein the oscillator is a digitally controlled oscillator (DCO) comprising a resonator tank having a capacitance determined based on the control signal.

8. The apparatus of claim 7, wherein the resonator tank comprises a plurality of capacitors selectable based on the control signal, and wherein the capacitance of the resonator tank is determined based on selected capacitors.

9. An apparatus for communication, comprising:
at least one processor to adaptively determine a scaling factor, to generate a nonlinearity correction signal based on the scaling factor to compensate for tuning nonlinearity of an oscillator, to generate a control signal for the oscillator by summing the nonlinearity correction signal, and to apply the control signal to the oscillator to adjust an oscillation frequency of the oscillator;
wherein the at least one processor applies a modulating signal via a lowpass modulation path to a first point of a phase locked loop (PLL), applies the modulating signal via a highpass modulation path to a second point of the PLL, applies the nonlinearity correction signal to the second point of the PLL, and generates the control signal with the modulating signal applied to the first and second points of the PLL and the nonlinearity correction signal applied to the second point of the PLL; and
wherein the at least one processor generates a phase error signal with the modulating signal applied to the first point of the PLL via the lowpass modulation path, filters the phase error signal with a loop filter to obtain a filtered phase error signal, and sums the filtered phase error signal, the nonlinearity correction signal, and the modulating signal after the highpass modulation path to obtain the control signal.

10. The apparatus of claim 6, wherein the at least one processor generates an envelope signal and a phase signal for polar modulation, and generates the modulating signal based on the phase signal.

11. The apparatus of claim 10, wherein the at least one processor performs quadrature to polar conversion of an inphase signal and a quadrature signal to obtain the envelope signal and the phase signal.

12. A method of controlling an oscillator, comprising:
generating a nonlinearity correction signal to compensate for n-th order tuning nonlinearity of an oscillator, where n is greater than one;
generating a control signal for the oscillator based on the nonlinearity correction signal; and
applying the control signal to the oscillator to adjust an oscillation frequency of the oscillator;
wherein generating the nonlinearity correction signal comprises obtaining an n-th order modulating signal based on a modulating signal, determining a scaling factor based on the n-th order modulating signal and a phase error signal, and generating the nonlinearity correction signal based on the n-th order modulating signal and the scaling factor.

13. The method of claim 12, wherein the generating the control signal comprises
applying the modulating signal via a lowpass modulation path to a first point of a phase locked loop (PLL),
applying the modulating signal via a highpass modulation path to a second point of the PLL,
applying the nonlinearity correction signal to the second point of the PLL, and
generating the control signal with the modulating signal applied to the first and second points of the PLL and the nonlinearity correction signal applied to the second point of the PLL.

14. A method of controlling an oscillator, comprising:
generating a nonlinearity correction signal to compensate for tuning nonlinearity of the oscillator;
generating a control signal for the oscillator based on the nonlinearity correction signal; and applying the control signal to the oscillator to adjust an oscillation frequency of the oscillator, wherein the nonlinearity correction signal compensates for second order tuning nonlinearity of the oscillator, and wherein the generating the nonlinearity correction signal comprises obtaining a squared modulating signal based on a modulating signal, determining a scaling factor based on the squared modulating signal and a phase error signal, and generating the nonlinearity correction signal based on the squared modulating signal and the scaling factor.

15. The method of claim 14, wherein the determining the scaling factor comprises multiplying the squared modulating signal and the phase error signal to obtain a first signal, deriving a second signal based on the first signal and an adaptation factor, and filtering the second signal to obtain the scaling factor.

16. An apparatus comprising:

means for generating a nonlinearity correction signal based on a scaling factor to compensate for tuning nonlinearity of an oscillator, wherein the means for generating the nonlinearity correction signal comprises means for adaptively determining the scaling factor;

means for summing the nonlinearity correction signal to obtain a control signal for the oscillator; and means for applying the control signal to the oscillator to adjust an oscillation frequency of the oscillator.

17. The apparatus of claim 16, wherein the nonlinearity correction signal compensates for second order tuning nonlinearity of the oscillator, and wherein the means for generating the nonlinearity correction signal comprises means for obtaining a squared modulating signal based on a modulating signal, and means for generating the nonlinearity correction signal based on the squared modulating signal and the scaling factor.

18. The apparatus of claim 16, wherein the means for adaptively determining the scaling factor comprises means for obtaining a squared modulating signal based on a modulating signal, means for multiplying the squared modulating signal and a phase error signal to obtain a first signal, means for deriving a second signal based on the first signal and an adaptation factor, and means for filtering the second signal to obtain the scaling factor.

19. An integrated circuit comprising:

at least one processor to generate a nonlinearity correction signal to compensate for n-th order tuning nonlinearity of an oscillator, to generate a control signal for the oscillator based on the nonlinearity correction signal, and to apply the control signal to the oscillator to adjust an oscillation frequency of the oscillator;

wherein n is greater than one, and wherein generating the nonlinearity correction signal comprises obtaining an n-th order modulating signal based on a modulating signal, determining a scaling factor based on the n-th order modulating signal and a phase error signal, and generating the nonlinearity correction signal based on the n-th order modulating signal and the scaling factor.

20. An integrated circuit comprising:

at least one processor to generate a nonlinearity correction signal to compensate for tuning nonlinearity of an oscillator, to generate a control signal for the oscillator based on the nonlinearity correction signal, and to apply the control signal to the oscillator to adjust an oscillation frequency of the oscillator, wherein the nonlinearity correction signal compensates for second order tuning nonlinearity of the oscillator, and wherein the at least one processor obtains a squared modulating signal based on a modulating signal, determines a scaling factor based on the squared modulating signal and a phase error signal, and generates the nonlinearity correction signal based on the squared modulating signal and the scaling factor.

21. A computer program product, comprising:

computer-readable medium comprising:

code for causing a computer to generate a nonlinearity correction signal to compensate for n-th order tuning nonlinearity of an oscillator, where n is greater than one;

code for causing the computer to generate a control signal for the oscillator based on the nonlinearity correction signal; and code for causing the computer to apply the control signal to the oscillator to adjust an oscillation frequency of the oscillator;

wherein generating the nonlinearity correction signal comprises obtaining an n-th order modulating signal based on a modulating signal, determining a scaling factor based on the n-th order modulating signal and a phase error signal, and generating the nonlinearity correction signal based on the n-th order modulating signal and the scaling factor.

* * * * *